United States Patent
Yang et al.

(10) Patent No.: US 8,114,484 B2
(45) Date of Patent: Feb. 14, 2012

(54) PLASMA ENHANCED CHEMICAL VAPOR DEPOSITION TECHNOLOGY FOR LARGE-SIZE PROCESSING

(75) Inventors: Ya-Tang Yang, Santa Clara, CA (US); Tae Kyung Won, San Jose, CA (US); Soo Young Choi, Fremont, CA (US); Takako Takehara, Hayward, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 931 days.

(21) Appl. No.: 11/833,983

(22) Filed: Aug. 4, 2007

(65) Prior Publication Data
US 2009/0022908 A1 Jan. 22, 2009

Related U.S. Application Data

(60) Provisional application No. 60/950,761, filed on Jul. 19, 2007.

(51) Int. Cl.
*H01H 1/24* (2006.01)
*C23C 16/00* (2006.01)

(52) U.S. Cl. ............... 427/579; 427/248.1; 427/255.394
(58) Field of Classification Search .............. 427/248.1, 427/255.394, 579
See application file for complete search history.

(56) References Cited

U.S. PATENT DOCUMENTS

| 5,399,387 A * | 3/1995 | Law et al. | 427/574 |
|---|---|---|---|
| 6,444,277 B1 * | 9/2002 | Law et al. | 427/574 |
| 2004/0241920 A1 * | 12/2004 | Hsiao et al. | 438/158 |
| 2005/0006556 A1 * | 1/2005 | Floyd et al. | 248/566 |
| 2005/0233092 A1 * | 10/2005 | Choi et al. | 427/569 |
| 2005/0233595 A1 * | 10/2005 | Choi et al. | 438/778 |
| 2006/0000411 A1 * | 1/2006 | Seo et al. | 118/715 |
| 2006/0078677 A1 * | 4/2006 | Won et al. | 427/248.1 |
| 2007/0116872 A1 * | 5/2007 | Li et al. | 427/248.1 |
| 2007/0116888 A1 * | 5/2007 | Faguet | 427/569 |

OTHER PUBLICATIONS

Bruno, G., et al., "Plasma Deposition of Amorphous Silicon-Based Materials", Academic Press, 1995, pp. 246-249.
Takehara, T., et al., "The Latest PECVD Technology for Large-size TFT-LCD", in Proc. IDW '04, 2004, pp. 603-606.
Takehara, T., et al., "The Latest PECVD Technology for Large-size Processing", in Proc. AM-FPD '06, 2006, pp. 95-98.
Tsai, Chuang-Chuang, et al., "Advanced PECVD Technology for Manufacturing AM LCDs", ASID '99, pp. 267-271.
Lieberman, M.A., et al. "Standing Wave and Skin Effects in Large-Area, High Frequency Capacitive Discharges", Plasma Sources Science Technology, vol. 11, No. 1, Jun. 2002 pp. 283-293.
Lacour, S.P., et al., "An Elastically Stretchable TFT Circuit", IEEE Electron Device Letters, vol. 25, No. 12, Dec. 2004, pp. 792-794.

(Continued)

*Primary Examiner* — Timothy Meeks
*Assistant Examiner* — Mandy Louie
(74) *Attorney, Agent, or Firm* — Patterson & Sheridan, L.L.P.

(57) ABSTRACT

Methods for forming a film stack suitable for transistor fabrication using a low temperature plasma enhanced chemical vapor deposition (PECVD) process are provided. In one embodiment, the method includes providing a substrate in a PECVD chamber, depositing a dual layer SiNx film on the substrate, depositing a dual layer amorphous silicon film on the SiNx film, and depositing a n-doped silicon film on the dual layer amorphous silicon film. The aforementioned films are deposited at a temperature less than about 300 degrees Celsius in the same PECVD chamber.

24 Claims, 9 Drawing Sheets

OTHER PUBLICATIONS

Lumelsky, M.S., et al., "Sensitive Skin", IEEE Sensors J, vol. 1, No. 1, Jun. 2001, pp. 41-51.

Gleskova, H., et al., "Amorphous Silicon Thin-Film Transistors on Compliant Polymide Foilsubstrates", IEEE Electron Device Lett., vol. 20, No. 9, Sep. 1999, pp. 473-475.

Kuo, Y, et al., "Plasma Processing in the Fabrication of Amorphous Silicon Thin-Film-Transistor Arrays", IBM J. Res. Develop., vol. 43, No. 1/2, Dec. 1999, pp. 73-87.

* cited by examiner

PLASMA ENHANCED CHEMICAL VAPOR DEPOSITION TECHNOLOGY FOR LARGE-SIZE PROCESSING

CROSS REFERENCE TO RELATED APPLICATIONS

This application claims benefit from U.S. Provisional Patent Application Ser. No. 60/950,761, filed Jul. 19, 2007, which is incorporated by reference in it entirety.

BACKGROUND OF THE INVENTION

1. Field of the Invention

Embodiments of the invention generally relate to a method for depositing silicon and nitride layers using a plasma enhanced chemical vapor deposition (PECVD) process.

2. Background

Substrate size expansion has been the enabler of the TFT-LCD industry. Since TFT-LCD production using substrates having a plan area of about 2000 $cm^2$ started in 1993, the growth rate of substrate size has been almost exponential, enlarging more than 30 times in plan area in 13 years. This rapid growth of substrate size has been very challenging for display manufactures, material suppliers and equipment makers; and a driving force for everyone to improve. Many challenges were faced in scaling up the plasma enhanced chemical vapor deposition (PECVD) reactors and PECVD processes to accommodate substrates having a 2160×2460 $mm^2$ plan area. The most severe challenges were maintaining the integrity and stability of larger electrodes, maintaining substrate temperature uniformity, maintaining gas distribution uniformity, and last but not least, maintaining the same or better film quality achieved during processing 2000 $cm^2$ substrates without sacrificing productivity.

As the substrate size has grown, thermal contraction of glass substrate has become more problematic for the photo engraving exposure process. Among TFT-LCD production processes, the most commonly used and highest process temperature is 350 degrees Celsius for the PECVD silicon nitride (SiNx) gate dielectric layers and amorphous silicon (a-Si) active layers. This relatively high temperature and other associated process conditions were arrived at for the first single-chamber PECVD for TFTs in and around the LCD industry's 2000 $cm^2$ substrate timeframe. Reducing the process temperature even by 60 degrees Celsius can drastically reduce thermal contraction. An additional or alternative benefit of lower temperature processing is the possibility to use a less expensive glass substrate which may have a higher coefficient of thermal expansion. A likely further benefit of reducing process temperature is improved PECVD hardware reliability and system utilization. While the benefits of lower temperature are several, current PECVD processes are optimized to obtain required quality with high deposition rate at 350 degrees Celsius; therefore simply lowering process temperature without discovering solutions for process conditions would degrade film quality. Additionally, reducing deposition rate to improve film quality at lower temperatures is not a viable solution since sacrificing deposition rate would reduce throughput, thereby making such a process impractical for a production systems.

SUMMARY

Embodiments for the invention generally relate to a method for depositing silicon and nitride layers using a plasma enhanced chemical vapor deposition (PECVD) process. In one embodiment, a method for forming a film stack suitable for transistor fabrication includes providing a substrate in a PECVD chamber, depositing a dual layer SiNx film on the substrate, depositing a dual layer amorphous silicon film on the SiNx film, and depositing a n-doped silicon film on the dual layer amorphous silicon film. The aforementioned films are deposited at a temperature less than about 300 degrees Celsius. In another embodiment, at least the SiNx and amorphous silicon films are deposited in the same PECVD chamber.

In another embodiment, a method for forming a film stack suitable for transistor fabrication includes depositing a first SiNx layer at a rate greater than about 1500 Å/min on the substrate at a temperature less than about 300 degrees Celsius, depositing a second silicon nitride layer at a rate less than 1500 Å/min on the first silicon nitride layer at a temperature less than about 300 degrees Celsius, wherein the first SiNx layer has a more SiH content than the second SiNx layer, depositing a first a-Si:H layer at a rate less than 600 Å/min on the second SiNx layer at a temperature less than about 300 degrees Celsius, depositing a second a-Si:H layer at a rate greater than 600 Å/min on the first a-Si:H layer at a temperature less than about 300 degrees Celsius, wherein the second a-Si:H layer has a higher optical bandgap as compared to the first a-Si:H layer, and depositing a n-doped silicon film on the dual layer amorphous silicon film at a temperature less than about 300 degrees Celsius.

In another embodiment, a second SiNx layer of a dual layer SiNx film is deposited by providing $SiH_4$ at a flow rate less than that provided during deposition of the first SiNx layer, providing $NH_3$ at a flow rate less than that provided during deposition of the first SiNx layer; providing $N_2$ at a flow rate greater than that provided during deposition of the first SiNx layer; and providing less RF power to sustain a plasma formed from the $SiH_4$ and $NH_3$ gases than that provided during deposition of the first SiNx layer.

In another embodiment, a second a-Si:H layer of a dual layer a-Si:H film is deposited by providing $SiH_4$ at a flow rate greater than that provided during deposition of the first a-Si:H layer and providing $H_2$ at a flow rate less than that provided during deposition of the first a-Si:H layer.

In yet another embodiment, the deposition process includes depositing a dual layer SiNx film on a glass or polymer substrate, depositing a dual layer amorphous silicon film on the SiNx film, and depositing a n-doped silicon film on the dual layer amorphous silicon film, wherein has a plan area greater than about 1.0 $m^2$.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

In FIG. 9A, the mobility degradation versus stress time for high temperature TFT and low temperature TFT is illustrated. Mobility was normalized to 1.0 at 0 min. In FIG. 9B, the threshold voltage shift versus stress time for high temperature TFT and low temperature TFT is illustrated. BTS tests were performed at about 80 degrees Celsius with Vg=about 40V for about 100 minutes for both FIGS. 9A-B.

In FIG. 10A, the threshold voltage shift versus the percentage of SiH bond in a low deposition rate SiNx layer is illustrated. In FIG. 10B, the threshold voltage shift versus wet etch rate is illustrated. BTS tests were performed at about 80 degrees Celsius with Vg=about 40V for about 100 minutes for both FIGS. 10A-B.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Figure 1:
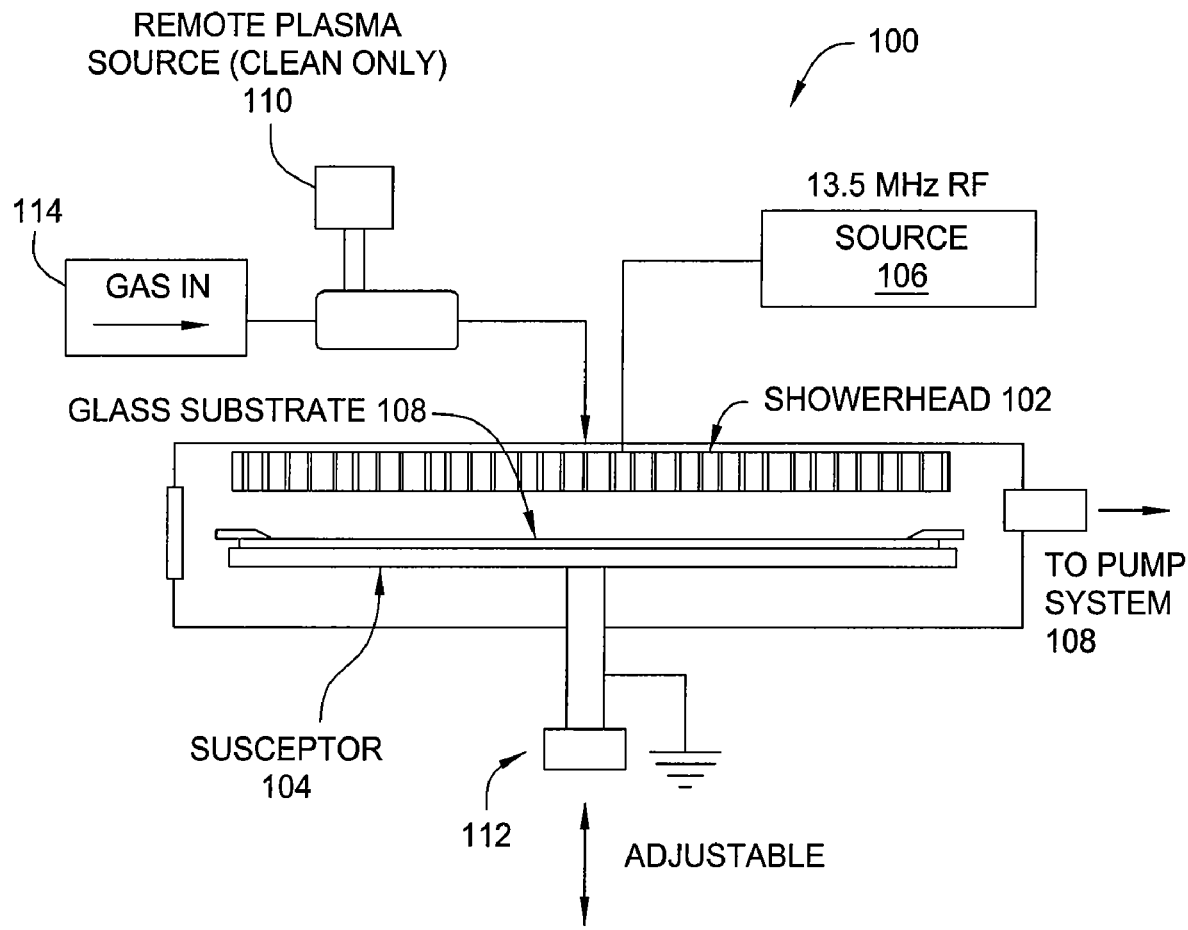
FIG. 1 is a schematic drawing of an exemplary PECVD process chamber suitable for practicing the invention.

FIG. 1 depicts one embodiment of a PECVD process chamber, such as available from AKT, Inc., a wholly owned subsidiary of Applied Materials, Inc., of Santa Clara, Calif. It is contemplated that suitably adapted PECVD process chambers available from other manufacturers may also be utilized. The PECVD process chamber comprises a parallel-plate, capacitively-coupled PECVD reactor. This process chamber can process substrates having a plan area up to about 1870×2200 mm$^2$, and can uniformly control plasma distribution and deposition over substrates having a plan area up to about 2.5 m$^2$.

The PECVD process chamber includes an upper electrode showerhead incorporates a proprietary hollow cathode effect which significantly enhances gas dissociation and ensures uniformly dissociated reactant gas across the entire substrate area. The bottom electrode, the susceptor, provides uniform multi-zone heating to the glass substrate at process set point temperatures up to 400 degrees Celsius. 13.5 MHz RF power is delivered to the showerhead. The process chamber is configured to deposited in-situ both dielectric films (such as SiNx, SiOx and SiOxNy, among others) and semiconductor films (such as a-Si:H and doped a-Si:H, among others) with good uniformity using the same set of hardware (i.e., without removing the substrate from the process chamber).

The process chamber is equipped with remote plasma source cleaning which effectively provides full dissociation of the cleaning gas outside of the process chamber. The active gas species flow downstream to the chamber to gently and efficiently etch away the film residues left by the CVD process. Typically NF$_3$ is used for cleaning because this gas can be nearly 100 percent dissociated and the effluent easily abated, thereby minimizing release of global-warming potential (GWP) gas to the environment.

Figure 2:
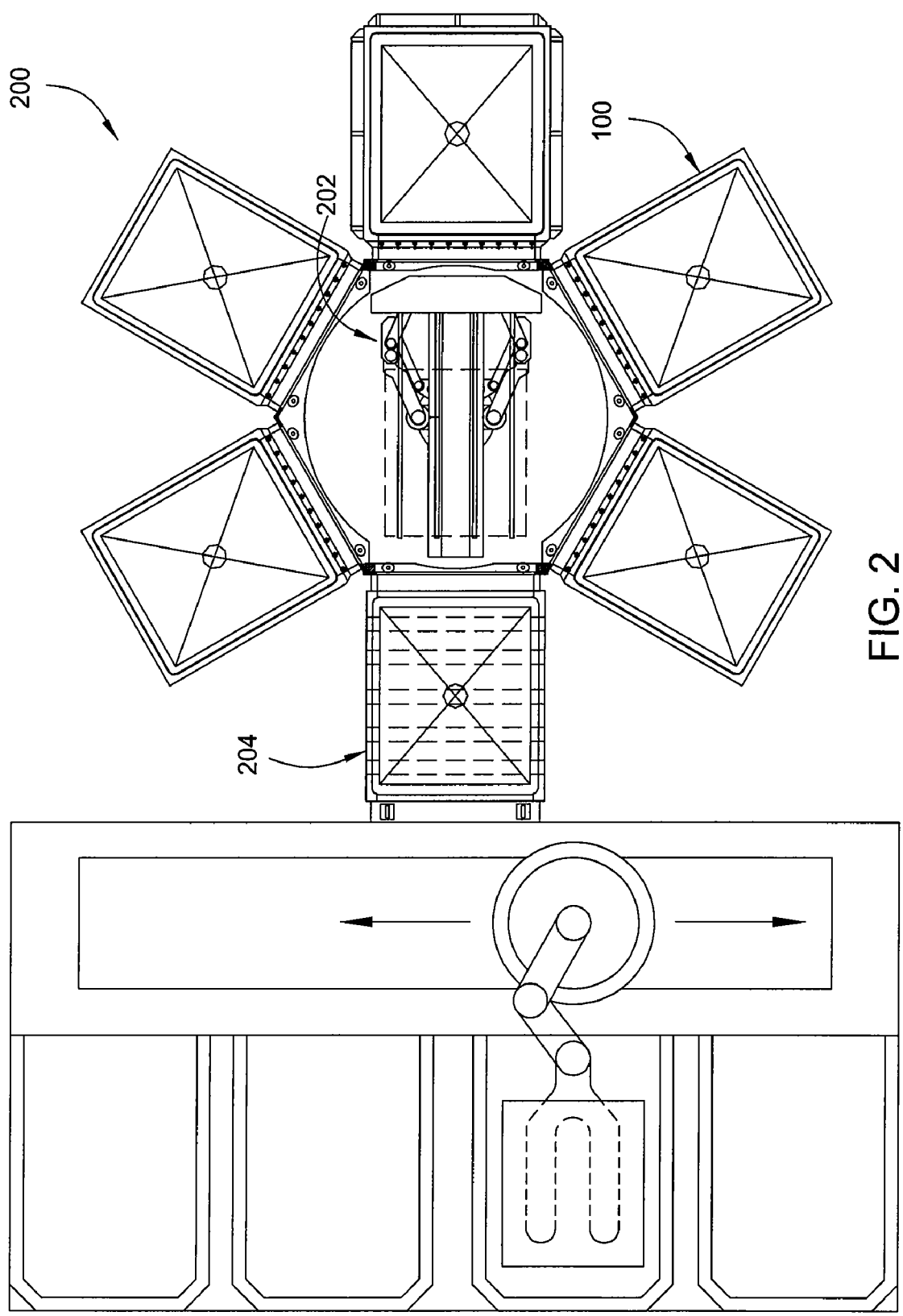
FIG. 2 is a perspective view of a PECVD System incorporating the PECVD process chamber of FIG. 1.

An exemplary PECVD cluster tool 200 is shown in FIG. 2. The technology of the cluster tool 200 has been production proven and has achieved broad acceptance. In one embodiment, the cluster tool 200 includes a transfer chamber 202 that accommodates a triple slot loadlock 204 and up to five process chambers 100. System throughput is supported by a dual-arm vacuum robot disposed in the transfer chamber 202. The three-layer deposition system for gate dielectric SiNx, a-Si:H and doped a-Si achieves a throughput of approximately 30 substrates/hr, and more than 60 substrates/hr has been achieved for single-layer film deposition utilizing the process discussed below.

The mechanical challenges have been solved through carefully engineering to minimize stresses, deflection and creep of the electrode and electrode supporting materials. Parallelism between the two electrodes can be controlled to less than +/−1 mm over a 2160×2460 mm$^2$ plan area substrate. Also the substrate temperature variation is maintained within less than 10 degrees Celsius over this large area.

The guiding principles used to scale up the PECVD processes are to maintain the intensive deposition parameters (pressure, electrode spacing, substrate temperature) as similar as possible to the previous generation, while somewhat proportionally increasing the extensive deposition parameters (gas flow rate, RF power). However as substrate size has increased beyond 1500×1800 mm$^2$ in plan area, there no longer is a way to adequately mitigate surface standing wave effects in the PECVD plasma and still maintain the same generation to generation deposition rates and system productivity. As such, proportionally increasing deposition parameters will not provide solutions for depositing films on substrates in excess of 1500×1800 mm$^2$ in plan area.

Figure 3:
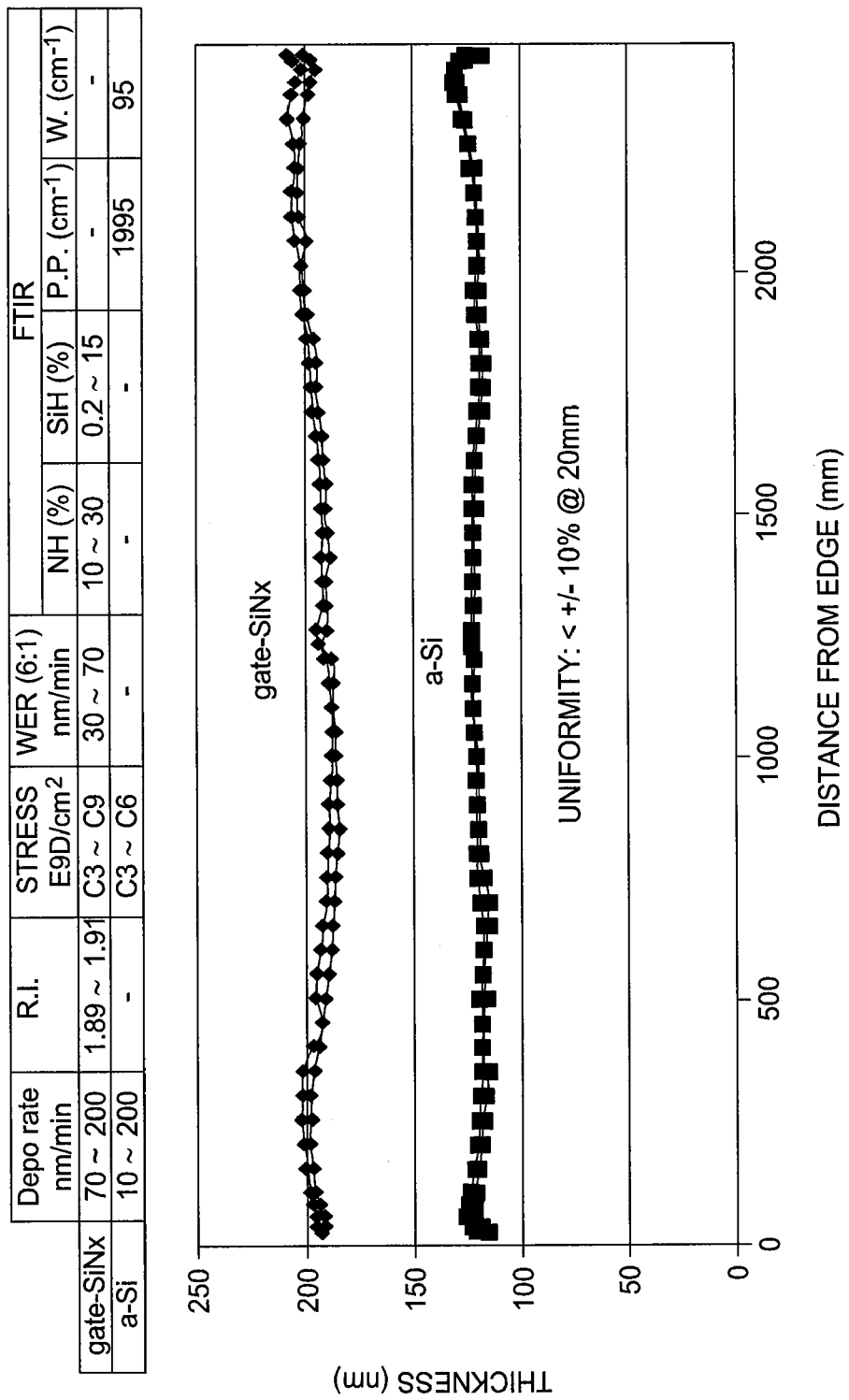
FIG. 3 is a chart depicting film properties and thickness profiles for SiNx and a-Si films deposited using the present invention.

FIG. 3 shows an example of the thickness profiles and film properties for SiNx and a-Si films deposited using the PECVD system 100 using the method of the present invention described below. These results are comparable to or better than results of films deposited on smaller substrates using previous generations of CVD equipment. The method has demonstrated the ability to deposit films with the same desirable range of properties such as refractive index, Fourier transform infrared (FTIR) spectra and wet etch rate as films deposited on smaller substrates in previous generations of processing systems.

In general, lowering process temperature causes the following issues; increasing dangling-bond density and Si—H$_2$ bond formation in a-Si film, and decreasing film density and increasing Si—H bond formation in SiNx film. These degraded film properties are associated with greater threshold voltage shift and lower electron mobility, among other transistor performance issues. In order to solve these issues, lowering deposition rate and/or applying very high frequency have been studied elsewhere. As stated earlier, lowering deposition rate strongly affects system throughput and productivity, so it is undesirable for production systems. Applying very high frequency would have a stronger surface standing wave effect, thus limiting scalability, thereby making high frequency power undesirable for depositing films on substrates having a plan area in excess of 1.0 m$^2$. Beneficially, the process of the present invention maintains film performance at the same level as high-temperature active layers, while also maintaining system productivity and throughput.

Figure 4:
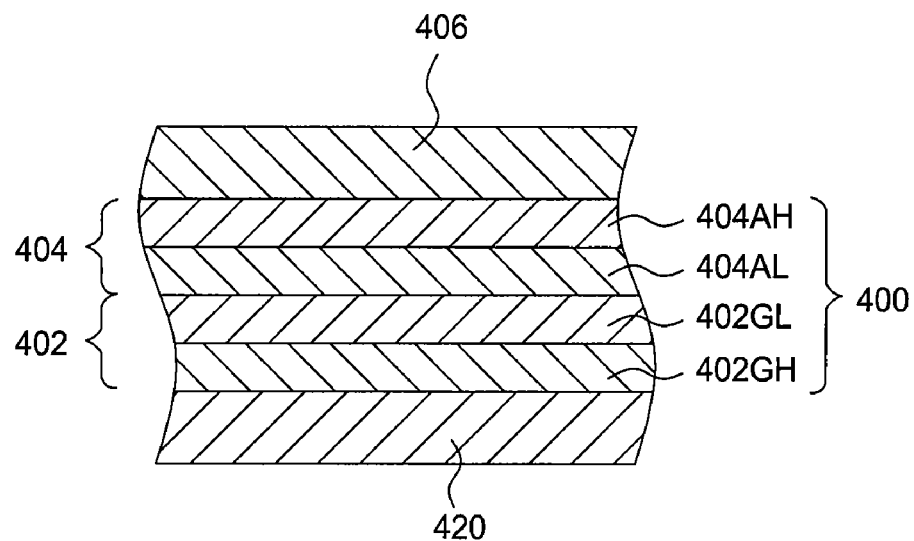
FIG. 4 is a film stack suitable for fabricating a TFT structure having layers deposited in accordance with the invention.

FIG. 4 is a film stack 400 disposed on a substrate 420 suitable for fabricating a TFT structure having layers deposited in accordance with one embodiment of the invention. The substrate 420 may be glass or polymer substrate, which in one embodiment, has a plan area greater than about 1.0 m². In one embodiment, the active layers of a-Si TFT film stack 400 consist of SiNx layer 402, a-Si:H layer 404 and phosphorous doped n+a-Si:H layer 406 (n+a-Si:H). In order to achieve panel makers' requirements in both productivity and process performance, the SiNx layer 402 is comprised of a high deposition rate SiNx layer 402GH and a low deposition rate SiNx layer 402GL, while the a-Si:H layer 404 comprises a low deposition rate a-SiNx layer 404AL and a high deposition rate a-SiNx layer 404AH. Here, the SiNx layer 402GH is deposited at rate greater than about 1500 Å/min for the gate dielectric, the SiNx layer 402GL is deposited at rate less than about 1500 Å/min for the gate dielectric, the a-Si:H layer 404AL is deposited at rate less than about 600 Å/min for a portion of the a-Si:H layer 404, and the a-Si:H layer 404AH is deposited at rate greater than about 600 Å/min for a portion of the a-Si:H layer 404. In one embodiment, the SiNx layer 402GH has a thickness of about 250 nm, the SiNx layer 402GL has a thickness of about 50 nm, the a-Si:H layer 404AL has a thickness of about 50 nm, the a-Si:H layer 404AH has a thickness of about 150 nm, and the n+a-Si:H layer 406 has a thickness of about 50 nm. The electron mean free path is on the order of a few angstroms and the carrier transport region of the a-Si is mostly within about 300 angstroms of the a-Si:H channel and gate dielectric interface. Therefore, mostly the film properties of the SiNx layer 402GL and the SiNx layer 402GL determine the device mobility, threshold voltage, and other performance attributes because these low deposition rate layers (SiNx layer 402GL and a-Si:H layer 404AL) are relatively thin, the film properties of those layers can be tuned and the deposition rate reduced if necessary to maintain high TFT performance without much effect on system productivity. On the other hand, one can increase the deposition rate of SiNx layer and a-Si:H layers 402GH, 404AH to compensate for the layer deposition rates of the SiNx and a-Si:H interface (e.g., SiNx layer and a-Si:H layers 402GL, 404AL) and maintain throughput without sacrificing device performance. Finally, the dual nitride layer 402 (comprised for layers 402GL and 402GH) can be engineered to have two different dry etch rates to produce a desirable tapered profile when using dry plasma etch to open the metal contact to the gate line of the transistor.

Figure 5:
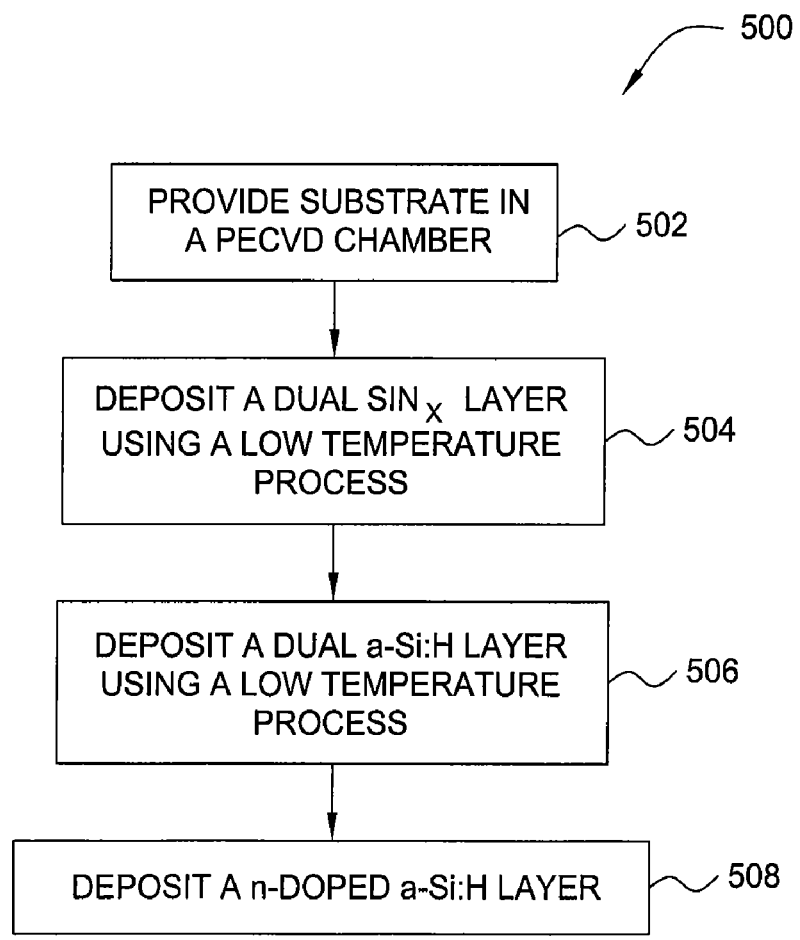
FIG. 5 is one embodiment of a method for fabricating the film stack of FIG. 4.

FIG. 5 is one embodiment of a method 500 for fabricating the film stack of FIG. 4. The method 500 begins at step 502 by providing a substrate 402 into a suitable PECVD process chamber, such as the process chamber 100 of FIG. 1. At step 504, a dual nitride layer 402 is deposited using a two step process. The dual nitride layer 402 is formed by depositing the SiNx layer 402GH at a high deposition rate followed by depositing the SiNx layer 402GL at a low deposition rate.

In one embodiment, the SiNx layer 402GH may deposited at a rate greater than about 1500 Å/min by forming a plasma from a gas mixture in the process chamber, heating the substrate while providing sufficient RF power to maintain the plasma during deposition. The gas mixture may be comprised of $SiH_4$ and $NH_3$ gases. $SiH_4$ may be provided at a flow rate of about 900 to about 3000 sccm/m² of substrate plan area, for example about 1500 to about 2000 sccm/m², or about 1800 sccm/m². $NH_3$ may be provided at a flow rate of about 5000 to about 15000 sccm/m² of substrate plan area, for example about 8000 to about 11000 sccm/m², or about 9600 sccm/m². The gas mixture may also include a carrier gas, such as $N_2$. In one embodiment, $N_2$ may be provided at a flow rate of about 7000 to about 30000 sccm/m² of substrate plan area, for example about 11000 to about 17000 sccm/m², or about 14000 sccm/m². Pressure is regulated within the processing chamber between about 1.0 to about 2.5 Torr, for example about 1.2 to about 1.8 Torr, or about 1.3 Torr. Power provided to maintain the plasma is may be delivered to the electrode of the processing chamber, and may be provided at about 3000 to about 7000 Watts/m² of substrate plan area, for example about 4800 to about 5800 Watts/m², or about 5300 Watts/m². Spacing may be maintained between the substrate and the showerhead in the range of about 850 to about 1200 mils, for example about 900 to about 1000 mils, or about 950 mils. During deposition, the temperature of the substrate is maintained between about 250 to about 300 degrees Celsius, for example about 280 to about 290 degrees Celsius, or about 285 degrees Celsius.

In one embodiment, the SiNx layer 402GL may deposited at a rate less than about 1500 Å/min by forming a plasma from a gas mixture in the process chamber, heating the substrate while providing sufficient RF power to maintain the plasma during deposition. The gas mixture may be comprised of $SiH_4$ and $NH_3$ gases. $SiH_4$ may be provided at a flow rate of about 300 to about 1000 sccm/m² of substrate plan area, for example about 600 to about 750 sccm/m², or about 650 sccm/m². $NH_3$ may be provided at a flow rate of about 1400 to about 4200 sccm/m² of substrate plan area, for example about 2500 to about 3100 sccm/m², or about 2800 sccm/m². The gas mixture may also include a carrier gas, such as $N_2$. In one embodiment, $N_2$ may be provided at a flow rate of about 9000 to about 27000 sccm/m² of substrate plan area, for example about 14400 to about 21600 sccm/m², or about 18000 sccm/m². Pressure is regulated within the processing chamber between about 0.8 to about 1.8 Torr, for example about 1.0 to about 1.3 Torr, or about 1.0 Torr. Power provided to maintain the plasma is may be delivered to the electrode of the processing chamber, and may be provided at about 1500 to about 4500 Watts/m² of substrate plan area, for example about 2800 to about 3400 Watts/m², or about 3100 Watts/m². Spacing may be maintained between the substrate and the showerhead in the range of about 450 to about 800 mils, for example about 500 to about 650 mils, or about 580 mils. During deposition, the temperature of the substrate is maintained between about 250 to about 300 degrees Celsius, for example about 280 to about 290 degrees Celsius, or about 285 degrees Celsius.

The SiNx layer 402GH has a SiH content greater than the SiNx layer 402GL. In generally, there are three kinds of bonding in SiN:H, Si—N, Si—H and N-H. The SiH content equals the SiH bond density/(SiH bond density+N—H bond density+SiN bond density). In one embodiment, the SiNx layer 402GH has a SiH content greater than about 5 percent SiH bond density while the SiNx layer 402GL has a SiH content less than about 5 percent SiH bond density. Additionally, the SiNx layer 402GL has a lower wet etch compared to the SiNx layer 402GH. For example, the SiNx layer 402GL may have wet etch less then 1000 Å/min compared to a wet etch rate of greater than 1000 Å/min for the SiNx layer 402GH.

At step 506, the dual a-Si:H layer 404 is deposited using a two step process. The dual amorphous silicon layer 404 is formed by depositing the a-Si:H layer 404AL at a low deposition rate followed by depositing the a-Si:H layer 404AH at a high deposition rate. The dual silicon nitride and dual amorphous silicon layers may be deposited in-situ the process chamber (i.e., without removing the substrate from the chamber).

In one embodiment, the a-Si:H layer 404AL may deposited at a rate less than about 600 Å/min by forming a plasma from a gas mixture in the process chamber, heating the substrate while providing sufficient RF power to maintain the plasma during deposition. The gas mixture may be comprised of $SiH_4$ and $H_2$ gases. $SiH_4$ may be provided at a flow rate of about 350 to about 1050 sccm/m$^2$ of substrate plan area, for example about 600 to about 800 sccm/m$^2$, or about 700 sccm/m$^2$. $H_2$ may be provided at a flow rate of about 1500 to about 6000 sccm/m$^2$ of substrate plan area, for example about 3000 to about 5000 sccm/m$^2$, or about 4500 sccm/m$^2$. In one embodiment, no carrier gases are utilized. Pressure is regulated within the processing chamber between about 1.2 to about 3.5 Torr, for example about 2.0 to about 2.5 Torr, or about 2.2 Torr. Power provided to maintain the plasma is may be delivered to the electrode of the processing chamber, and may be provided at about 200 to about 700 Watts/m$^2$ of substrate plan area, for example about 350 to about 550 Watts/m$^2$, or about 460 Watts/m$^2$. Spacing may be maintained between the substrate and the showerhead in the range of about 400 to about 800 mils, for example about 450 to about 550 mils, or about 500 mils. During deposition, the temperature of the substrate is maintained between about 250 to about 300 degrees Celsius, for example about 280 to about 290 degrees Celsius, or about 285 degrees Celsius.

In one embodiment, the a-Si:H layer 404AH may deposited at a rate greater than about 600 Å/min by forming a plasma from a gas mixture in the process chamber, heating the substrate while providing sufficient RF power to maintain the plasma during deposition. The gas mixture may be comprised of $SiH_4$ and $H_2$ gases. $SiH_4$ may be provided at a flow rate of about 700 to about 2800 sccm/m$^2$ of substrate plan area, for example about 1260 to about 1540 sccm/m$^2$, or about 1400 sccm/m$^2$. $H_2$ may be provided at a flow rate of about 1000 to about 7000 sccm/m$^2$ of substrate plan area, for example about 3000 to about 6000 sccm/m$^2$, or about 5000 sccm/m$^2$. In one embodiment, no carrier gases are utilized. Pressure is regulated within the processing chamber between about 1.2 to about 3.5 Torr, for example about 2.0 to about 2.5 Torr, or about 2.2 Torr. Power provided to maintain the plasma is may be delivered to the electrode of the processing chamber, and may be provided at about 500 to about 1800 Watts/m$^2$ of substrate plan area, for example about 1000 to about 1300 Watts/m$^2$, or about 1100 Watts/m$^2$. Spacing may be maintained between the substrate and the showerhead in the range of about 400 to about 800 mils, for example about 450 to about 550 mils, or about 500 mils. During deposition, the temperature of the substrate is maintained between about 250 to about 300 degrees Celsius, for example about 280 to about 290 degrees Celsius, or about 285 degrees Celsius.

The a-Si:H layer 404AH has a higher optical bandgap (E04 and Etauc) as compared to the a-Si:H layer 404AL. In one embodiment, the a-Si:H layer 404AH has an optical bandgap E04 greater than about 1.90 eV while the a-Si:H layer 404AL has an optical bandgap E04 between about 1.86-1.89 eV. In one embodiment, the a-Si:H layer 404AH has an optical bandgap Etauc greater than about 1.88 eV while the a-Si:H layer 404AL has an optical bandgap Etauc between about 1.83-1.85 eV.

The combinations of the properties of the SiNx layer 402GL and the a-Si:H layer 404AL results in an interface having improved electron mobility and threshold voltage which results in improved transistor performance. TFTs manufactured using this low temperature process have demonstrated about 20 percent higher mobility as compared to TFTs manufactured using high temperature processes. Advantageously, manufactures may interchange passivation layer PECVD (typically performed at temperatures just under 300 degrees Celsius, with an active layer PECVD. Additionally, the lower processing temperature contributes to longer periods between chamber service intervals. Moreover, as the thicknesses of these layers are selected to be just thick enough to obtain performance goals, the remaining thicknesses of there respective layers may be deposited using higher deposition rate techniques, thereby minimizing the impact on process throughput.

At step 508, the n+a-Si:H layer 406 is deposited. The n+a-Si:H layer may be deposited in the same process chamber as the dual silicon nitride and dual amorphous silicon layers described above.

In one embodiment, the n+a-Si:H layer 406 is deposited by forming a plasma from a gas mixture in the process chamber, heating the substrate while providing sufficient RF power to maintain the plasma during deposition. The gas mixture may be comprised of $SiH_4$, $H_2$ and $PH_3$ gases. $SiH_4$ may be provided at a flow rate of about 400 to about 1500 sccm/m$^2$ of substrate plan area, for example about 800 to about 1100 sccm/m$^2$, or about 950 sccm/m$^2$. $H_2$ may be provided at a flow rate of about 1000 to about 6000 sccm/m$^2$ of substrate plan area, for example about 2500 to about 3500 sccm/m$^2$, or about 2900 sccm/m$^2$. $PH_3$ may be provided at a flow rate of about 500 to about 5000 sccm/m$^2$ of substrate plan area, for example about 1500 to about 2500 sccm/m$^2$, or about 2200 sccm/m$^2$. Pressure is regulated within the processing chamber between about 1.2 to about 3.5 Torr, for example about 1.5 to about 2.0 Torr, or about 1.8 Torr. Power provided to maintain the plasma is may be delivered to the electrode of the processing chamber, and may be provided at about 200 to about 800 Watts/m$^2$ of substrate plan area, for example about 400 to about 550 Watts/m$^2$, or about 450 Watts/m$^2$. Spacing may be maintained between the substrate and the showerhead in the range of about 400 to about 800 mils, for example about 450 to about 550 mils, or about 500 mils. During deposition, the temperature of the substrate is maintained between about 250 to about 300 degrees Celsius, for example about 280 to about 290 degrees Celsius, or about 285 degrees Celsius.

Figure 6:
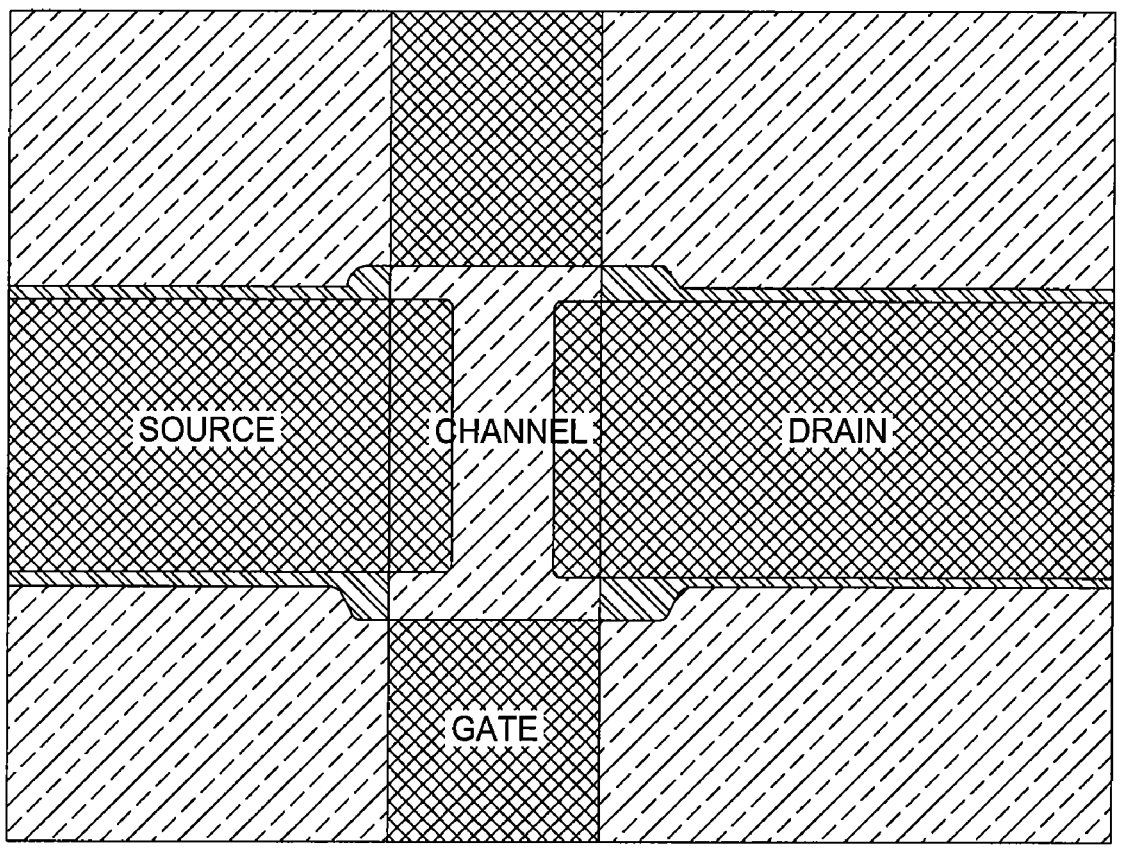
FIG. 6 is an optical micrograph of one embodiment of a TFT device fabricated using layers deposited using the present invention. The channel width is about 40 μm and channel length is about 10 μm.
Figure 7:
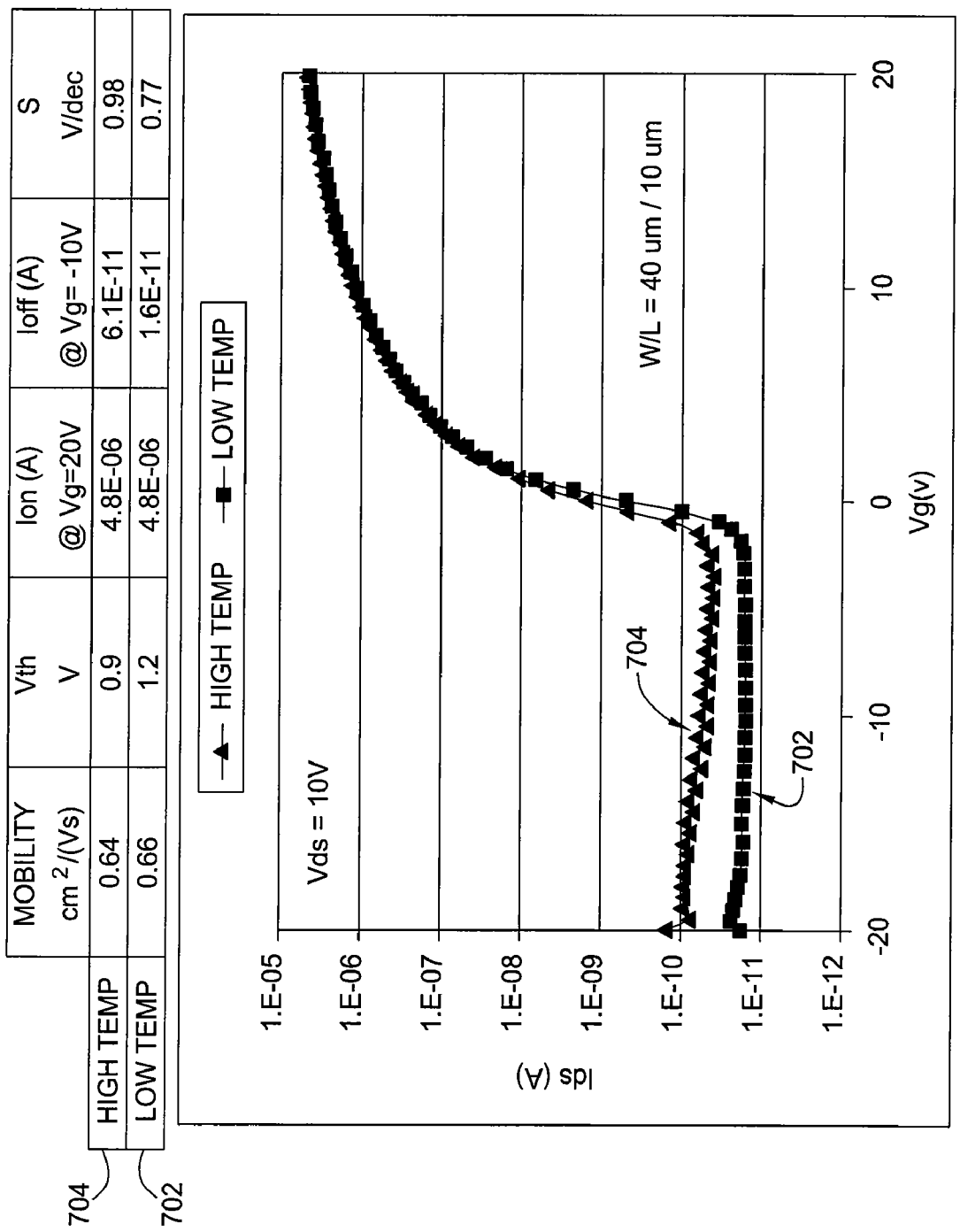
FIG. 7 is a chart of TFT transfer characteristics and electrical properties of films deposited using the low-temperature processes and high-temperature processes. Off current is high and not repeatable because channel etch process is not well developed.

TFT performance was confirmed using a simple back-channel type TFT with a 40 μm channel width (W) and 10 μm channel length (L), as shown in FIG. 6. The gate region is fabricated from the film stack 400 of FIG. 4 using the method of FIG. 5. FIG. 7 shows an example of TFT transfer characteristics using low-temperature deposition processes such as the process 500 described above (labeled with reference numeral 702) compared to conventional high-temperature deposition processes (labeled with reference numeral 704). It should be noted that all films (SiNx layer 402GL, SiNx layer 402GH, a-Si:H layer 404AL, a-Si:H layer 404AH and n+a-SI:H Layer 406) utilized to formed the low temperature deposition TFT were deposited sequentially in one single process chamber. These initial TFT characteristics using low temperature processes show equivalent performance to the ones using high temperature processes.

Figure 8:
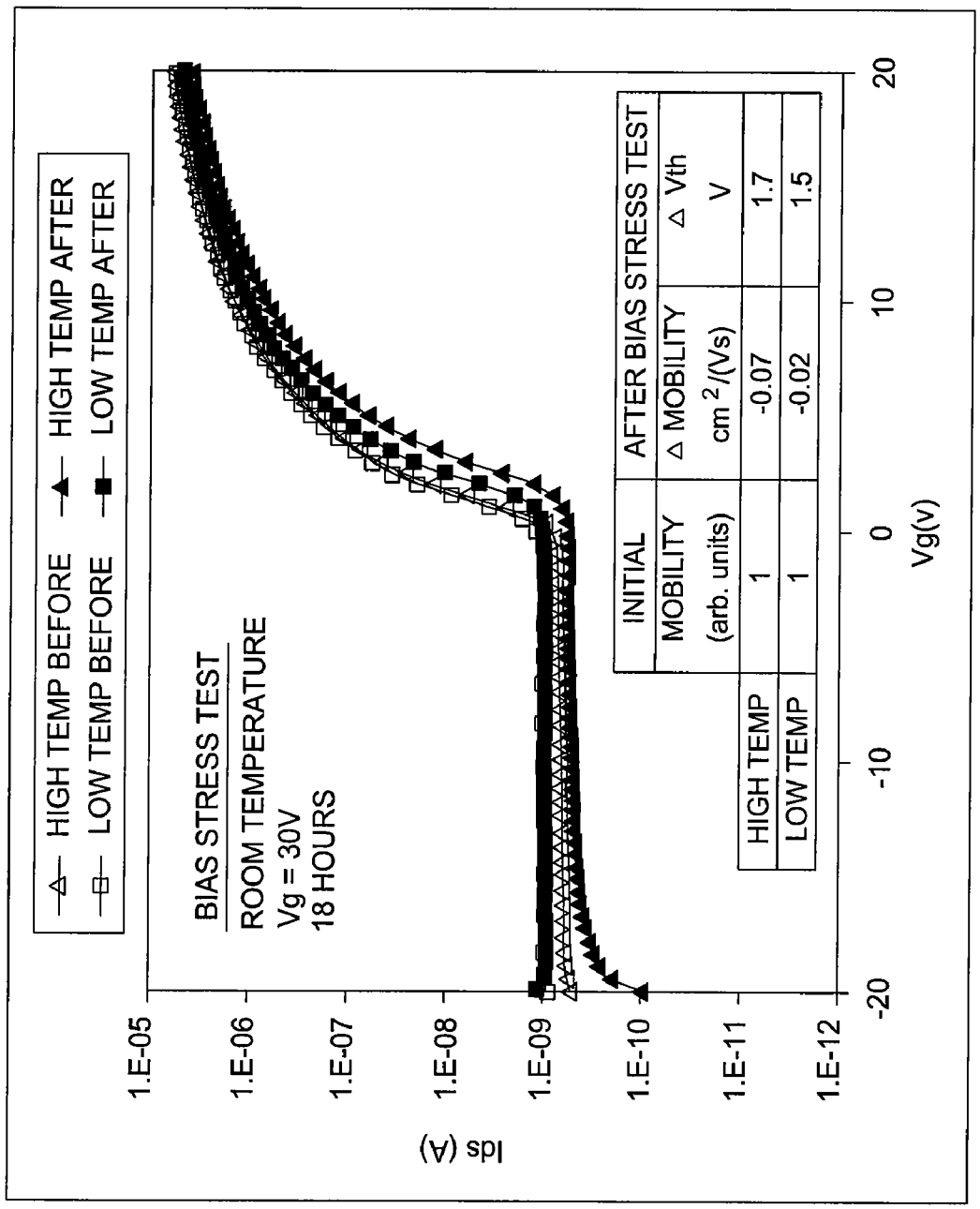
FIG. 8 is a chart of bias stress test results of low-temperature TFT and high-temperature TFT. Bias stress tests were carried out at about room temperature with Vg=30V for about 1080 minutes. Off current is high due to the channel etch process.

FIG. 8 shows an example of non-accelerated bias stress test results. The non-accelerated bias stress test was carried out at room temperature with 30V of gate bias voltage for 1080 minutes. The results show the TFT formed with low temperature processes achieved slightly smaller device degradation as compared with the TFT formed with high-temperature processes. As illustrated, the newly-developed low-temperature deposition processes of the present invention have been comparable to conventional high-temperature deposition processes in terms of TFT performance.

Figure 9B:
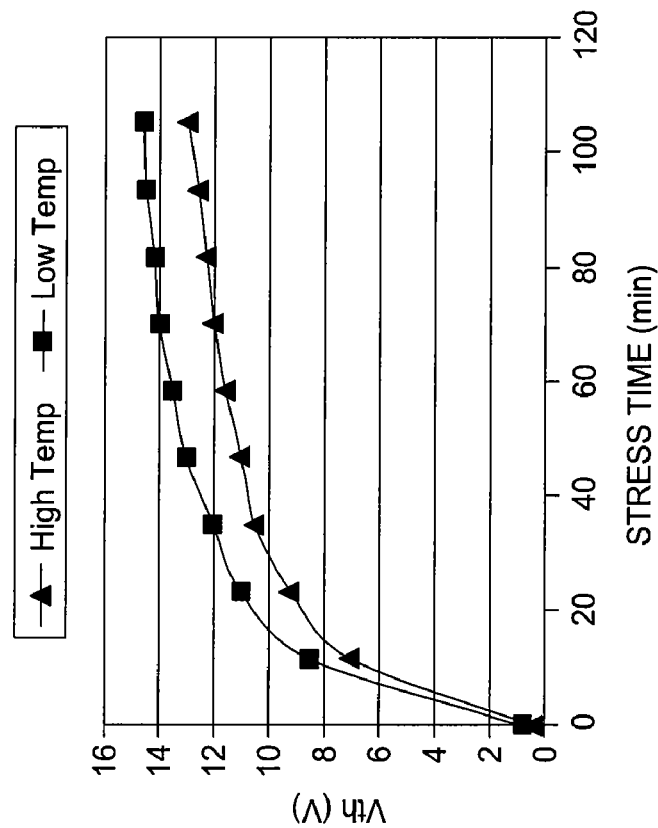
FIGS. 9A-B are charts of threshold voltage shift and mobility degradation versus stress time.
Figure 9A:
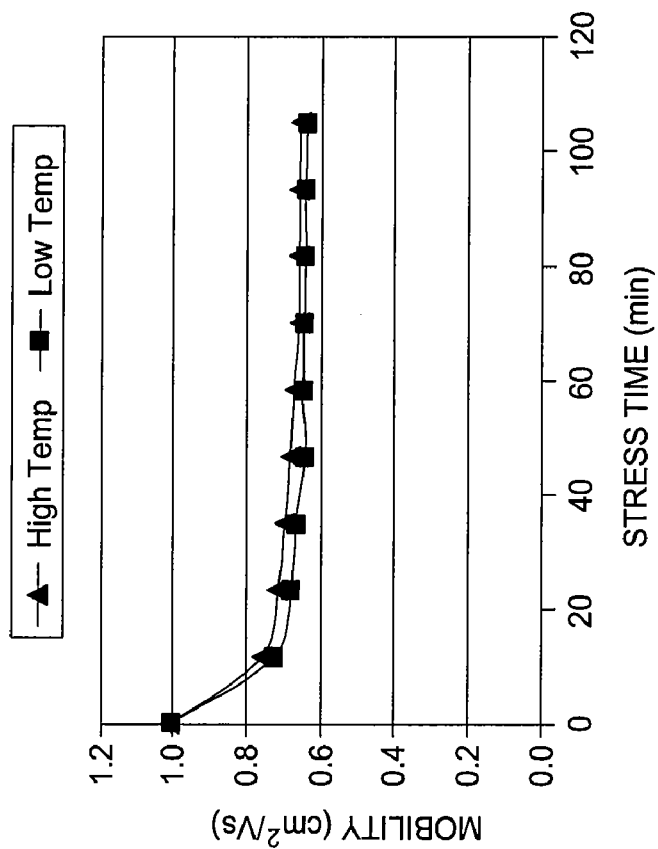

As a final test of reliability, accelerated bias temperature stress (BTS) tests were performed at 80 degrees Celsius with 40V of gate bias voltage for 100 minutes. FIGS. 9A-B show TFT characteristics degradation over time. Under such an extreme stress condition, the low-temperature processes show film/TFT results inferior to the high-temperature processes. A trend study was performed on the most critical layers, SiNx layer 402GL and a-Si:H layer 404AL.

Figure 10B:
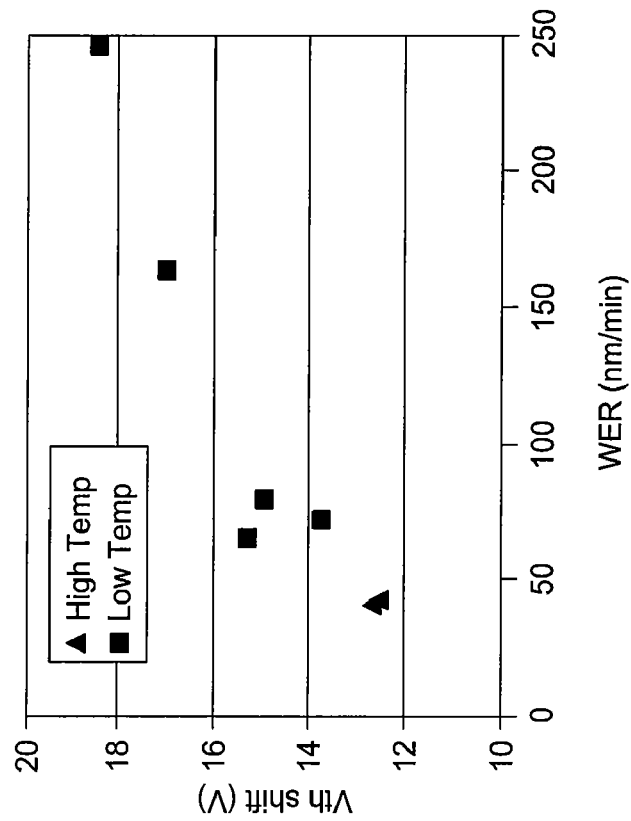
FIGS. 10A-B are charts of threshold voltage shift trend study results for low temperature TFT and high temperature TFT.
Figure 10A:
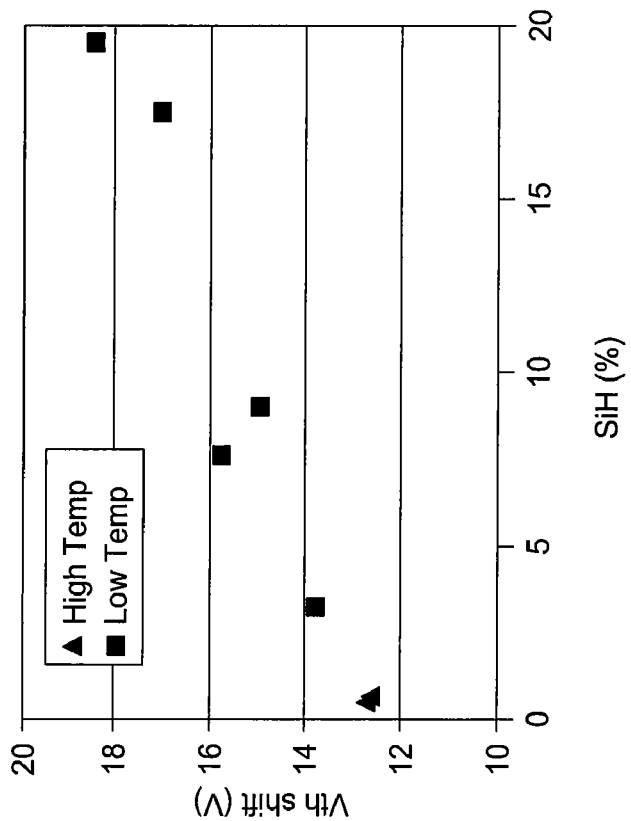

FIGS. 10A-B illustrates an example of trend study results. In this particular case, only SiNx conditions for low deposition rate films were modified to obtain films having several different Si—H concentrations and wet etching rates, but refractive index was fixed at 1.9. The high-temperature process results are shown there too. As expected, films having higher Si—H concentration or higher wet etching rate suffer a greater threshold voltage shift. TFT with lower temperature processes shows inferior performance as compared to those with high temperature. This composition dependence on gate dielectric can be attributed to formation of charge trap sites in SiNx. Note that this is also opposite to the trend shown in non-accelerated BTS in FIG. 8. In non-accelerated BTS, the dominating mechanism is metastable state creation in a-Si:H channel. Therefore, the threshold voltage shift for low temperature process is very close to that of high temperature process and shows no composition dependence on SiNx.

Based on the trend study results, it is understood that the low-temperature, low deposition rate SiNx deposition process may be further optimized to obtain lower wet etch rate and lower Si—H concentration. The other films, high deposition rate SiNx, high deposition rate a-Si:H, low deposition rate a-Si:H and n+a-SI:H layer were satisfactory.

Substrate size expansion has so far been a fact of life in the TFT-LCD industry. This substrate size expansion has provided economies of scale for large-size LCD production. As plasma reactors have been made correspondingly larger, surface standing wave effects have seriously come into play for larger parallel-plate reactors. In order to address these issues, an innovative process chamber, which fundamentally changed the distribution of plasma power in the chamber, was developed. Fortunately the innovations the latest PECVD systems comprise are scalable to any foreseeable size that the TFT-LCD industry may need.

As substrate size increases, lowering the processing temperature is getting ever more important to improve production yield and lower LCD manufacturing costs. Reducing the process temperature even by 60 degrees Celsius is beneficial. In this invention, sub-300 degrees Celsius deposition processes were developed, with both single-layer properties and TFT characteristics confirmed to be nearly equivalent to currently used high-temperature processes in mass production lines.

One advantage of low temperature TFT formation as described herein is compatibility for use on polymer substrates. For, example it is envisioned that polymer substrates will be used to build TFT devices and then OLED devices thereover to make flexible displays to take advantage of improved brightness, less power consumption, smaller sizes and increased viewing angles as compared to LEDs.

While the foregoing is directed to the preferred embodiment of the present invention, other and further embodiments of the invention may be devised without departing from the basic scope thereof. The scope of the invention is determined by the claims which follow.

What is claimed is:

1. A method for forming a film stack suitable for transistor fabrication, the method comprising:
    positioning a substrate in a plasma enhanced chemical vapor deposition (PECVD) chamber;
    depositing a first silicon nitride layer on the substrate with a first deposition rate at a temperature less than about 300 degrees Celsius in the PECVD chamber, wherein the substrate is at a first spacing from a showerhead of the process chamber during deposition of the first silicon nitride layer;
    depositing a second silicon nitride layer with a second deposition rate on the first silicon nitride layer at a temperature less than about 300 degrees Celsius in the PECVD chamber, wherein the first deposition rate is greater than the second deposition rate and the substrate is at a second spacing from the showerhead during deposition of the second silicon nitride layer that is smaller than the first spacing;
    depositing a dual layer amorphous silicon film on the second silicon nitride layer at a temperature less than about 300 degrees Celsius in the PECVD chamber; and
    depositing a n-doped silicon film on the dual layer amorphous silicon film at a temperature less than about 300 degrees Celsius in the PECVD chamber.

2. The method of claim 1, wherein depositing the first and second silicon nitride layers further comprises:
    depositing the first silicon nitride layer at a rate greater than 1500 Å/min on the substrate; and
    depositing the second silicon nitride layer at a rate less than 1500 Å/min on the first silicon nitride layer, wherein the first silicon nitride layer has a higher SiH content than the second silicon nitride layer.

3. The method of claim 2, wherein depositing the first silicon nitride layer further comprises:
    forming a plasma from a first gas mixture comprising $SiH_4$, $N_2$ and $NH_3$ gases.

4. The method of claim 3, wherein depositing the first silicon nitride layer further comprises:
    providing $SiH_4$ at a flow rate of about 900 to about 3000 sccm/m² of substrate plan area;
    providing $NH_3$ at a flow rate of about 5000 to about 15000 sccm/m² of substrate plan area; and
    providing $N_2$ at a flow rate of about 7000 to about 30000 sccm/m² of substrate plan area.

5. The method of claim 3, wherein depositing the first silicon nitride layer further comprises:
    maintaining a temperature of the substrate between about 250 to about 300 degrees Celsius.

6. The method of claim 5, wherein depositing the first silicon nitride layer further comprises:
    regulating chamber pressure between about 1.0 to about 2.5 Torr; and
    providing between 3000 to about 7000 Watts/m² of substrate plan area of power to maintain the plasma of the first gas mixture, wherein the first spacing is between about 850 to about 1200 mils.

7. The method of claim 3, wherein depositing the second silicon nitride layer further comprises:
    forming a plasma from a second gas mixture comprising $SiH_4$, $NH_3$ and $N_2$ gases.

8. The method of claim 7, wherein depositing the second silicon nitride layer further comprises:
    providing $SiH_4$ at a flow rate of about 300 to about 1000 sccm/m² of substrate plan area;
    providing $NH_3$ at a flow rate of about 1400 to about 4200 sccm/m² of substrate plan area; and
    providing $N_2$ at a flow rate of about 9000 to about 18000 sccm/m² of substrate plan area.

9. The method of claim 3, wherein depositing the second silicon nitride layer further comprises:
maintaining a temperature of the substrate between about 250 to about 300 degrees Celsius.

10. The method of claim 5, wherein depositing the second silicon nitride layer further comprises:
regulating chamber pressure between about 0.8 to about 1.8 Torr; and
providing between 1500 to about 4500 Watts/m$^2$ of substrate plan area of power to maintain the plasma of the gas mixture, wherein the second spacing is between about 450 to about 800 mils.

11. The method of claim 1, wherein depositing the dual layer amorphous silicon film further comprises:
depositing a first a-Si:H layer at a rate less than 600 Å/min on the substrate; and
depositing a second a-Si:H layer at a rate greater than 600 Å/min on the first a-Si:H layer in the PECVD chamber, wherein the second a-Si:H layer has a higher optical bandgap as compared to the first a-Si:H layer.

12. The method of claim 11, wherein depositing the first a-Si:H layer further comprises:
forming a plasma from a first gas mixture comprising SiH$_4$ and H$_2$ gases.

13. The method of claim 12, wherein depositing the first a-Si:H layer further comprises:
providing SiH$_4$ at a flow rate of about 350 to about 1050 sccm/m$^2$ of substrate plan area; and
providing H$_2$ at a flow rate of about 1500 to about 6000 sccm/m$^2$ of substrate plan area.

14. The method of claim 13, wherein depositing the first a-Si:H layer further comprises:
maintaining a temperature of the substrate between about 250 to about 300 degrees Celsius.

15. The method of claim 14, wherein depositing the first a-Si:H layer further comprises:
regulating chamber pressure between about 1.2 to about 3.5 Torr;
providing between 200 to about 700 Watts/m$^2$ of substrate plan area of power to maintain the plasma of the first gas mixture; and
spacing the substrate between about 400 to about 800 mils from the showerhead.

16. The method of claim 12, wherein depositing the second a-Si:H layer further comprises:
providing SiH$_4$ at a flow rate of about 700 to about 2800 sccm/m$^2$ of substrate plan area; and
providing H$_2$ at a flow rate of about 1000 to about 7000 sccm/m$^2$ of substrate plan area.

17. The method of claim 16, wherein depositing the second a-Si:H layer further comprises:
maintaining a temperature of the substrate between about 250 to about 300 degrees Celsius.

18. The method of claim 17, wherein depositing the second a-Si:H layer further comprises:
regulating chamber pressure between about 1.2 to about 3.5 Torr;
providing between 500 to about 1800 Watts/m$^2$ of substrate plan area of power to maintain the plasma of the gas mixture; and
spacing the substrate between about 400 to about 800 mils from the showerhead.

19. A method for forming a film stack suitable for transistor fabrication, the method comprising:
positioning a substrate in a plasma enhanced chemical vapor deposition (PECVD) chamber;
depositing a first silicon nitride layer at a rate greater than 1500 Å/min on the substrate at a temperature less than about 300 degrees Celsius in the PECVD chamber, wherein the substrate is spaced at a first spacing from a showerhead of the process chamber during deposition of the first silicon nitride layer;
depositing a second silicon nitride layer at a rate less than 1500 Å/min on the first silicon nitride layer at a temperature less than about 300 degrees Celsius in the PECVD chamber, wherein the first silicon nitride layer has a higher SiH content than the second silicon nitride layer, and wherein the substrate is spaced at a second spacing from the showerhead during deposition of the second silicon nitride layer that is smaller than the first spacing;
depositing a first a-Si:H layer at a rate less than 600 Å/min on the second silicon nitride layer at a temperature less than about 300 degrees Celsius in the PECVD chamber;
depositing a second a-Si:H layer at a rate greater than 600 Å/min on the first a-Si:H layer at a temperature less than about 300 degrees Celsius in the PECVD chamber, wherein the second a-Si:H layer has a higher optical bandgap as compared to the first a-Si:H layer; and
depositing a n-doped silicon film on the dual layer amorphous silicon film at a temperature less than about 300 degrees Celsius in the PECVD chamber.

20. The method of claim 19, wherein the depositing the second silicon nitride layer further comprises:
providing SiH$_4$ at a flow rate less than that provided during deposition of the first silicon nitride layer;
providing NH$_3$ at a flow rate less than that provided during deposition of the first silicon nitride layer;
providing N$_2$ at a flow rate greater than that provided during deposition of the first silicon nitride layer; and
providing less RF power to sustain a plasma formed from the SiH$_4$ and NH$_3$ gases than that provided during deposition of the first silicon nitride layer.

21. The method of claim 19, wherein the depositing the second a-Si:H layer further comprises:
providing SiH$_4$ at a flow rate greater than that provided during deposition of the first a-Si:H layer;
providing H$_2$ at a flow rate less than that provided during deposition of the first a-Si:H layer; and
providing less RF power to sustain a plasma formed from SiH$_4$ and H$_2$ gases than that provide during deposition of the first a-Si:H layer.

22. The method of claim 19, wherein the substrate is a glass or polymer substrate, the substrate having a plan area greater than about 1.0 m$^2$.

23. The method of claim 19, wherein the first spacing is between about 850 to about 1200 mils, and wherein the second spacing is between about 450 to about 800 mils.

24. A method for forming a film stack suitable for transistor fabrication, the method comprising:
depositing a first silicon nitride layer on a substrate by supplying a first gas mixture having first SiH$_4$ flow rate at a temperature less than about 300 degrees Celsius in a plasma enhanced chemical vapor deposition (PECVD) chamber, wherein the substrate is spaced between about 850 mils to about 1200 mils from a showerhead of the PECVD chamber during deposition of the first silicon nitride layer; and
depositing a second silicon nitride layer on the first silicon nitride layer by supplying a second gas mixture having a second SiH$_4$ as flow rate that is lower than the first SiH$_4$ gas flow rate at a temperature less than about 300 degrees Celsius in the PECVD chamber, wherein the substrate is spaced between about 450 mils to about 800 mils from the showerhead during deposition of the second silicon nitride layer.

* * * * *

UNITED STATES PATENT AND TRADEMARK OFFICE
CERTIFICATE OF CORRECTION

PATENT NO. : 8,114,484 B2
APPLICATION NO. : 11/833983
DATED : February 14, 2012
INVENTOR(S) : Yang et al.

Page 1 of 1

It is certified that error appears in the above-identified patent and that said Letters Patent is hereby corrected as shown below:

In the Claims:

Column 12, Claim 24, Line 50, please insert --a-- after having;

Column 12, Claim 24, Line 50, please insert --gas-- before flow;

Column 12, Claim 24, Line 59, please delete "as" and insert --gas-- therefor.

Signed and Sealed this
Fifteenth Day of May, 2012

David J. Kappos
*Director of the United States Patent and Trademark Office*